(12) United States Patent
Nandi et al.

(10) Patent No.: US 9,425,771 B2
(45) Date of Patent: Aug. 23, 2016

(54) LOW AREA FLIP-FLOP WITH A SHARED INVERTER

(71) Applicant: Texas Instruments Incorporated, Dallas, TX (US)

(72) Inventors: Suvam Nandi, Bangalore (IN); Badarish Mohan Subbannavar, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 70 days.

(21) Appl. No.: 14/498,048

(22) Filed: Sep. 26, 2014

(65) Prior Publication Data

US 2016/0094203 A1 Mar. 31, 2016

(51) Int. Cl.
*H03K 3/356* (2006.01)
*H03K 3/012* (2006.01)
*H03K 3/3562* (2006.01)

(52) U.S. Cl.
CPC ............ *H03K 3/012* (2013.01); *H03K 3/35606* (2013.01); *H03K 3/35625* (2013.01)

(58) Field of Classification Search
CPC ...................................................... H03K 3/012
See application file for complete search history.

(56) References Cited

U.S. PATENT DOCUMENTS

| | | | | |
|---|---|---|---|---|
| 5,982,211 A | * | 11/1999 | Ko | ........................ H03K 17/693 327/202 |
| 2003/0137336 A1 | * | 7/2003 | Okamoto | ......... H03K 19/00323 327/333 |

* cited by examiner

*Primary Examiner* — Daniel Puentes
(74) *Attorney, Agent, or Firm* — John R. Pessetto; Charles A. Brill; Frank D. Cimino

(57) ABSTRACT

A flip-flop is disclosed that utilizes low area. The flip-flop includes a tri-state inverter that receive a flip-flop input, a clock input and an inverted clock input. A master latch receives an output of the tri-state inverter. The master latch includes a common inverter. A slave latch is coupled to the master latch. The common inverter is shared between the master latch and the slave latch. An output inverter is coupled to the common inverter and generates a flip-flop output.

20 Claims, 3 Drawing Sheets

LOW AREA FLIP-FLOP WITH A SHARED INVERTER

TECHNICAL FIELD

Embodiments of the disclosure relate to low power clock gated flip-flops in an integrated circuit.

BACKGROUND

As a result of the continuous developments in integrated circuits (ICs), the flip-flops contribute to a substantial portion of any circuit design's power. The various units of an IC that consume power are logic implementation, flip-flops, RAM, clock tree and integrated clock gating (ICG) cells. The comparison of the power consumption by the various units is as follows; logic implementation 29%, flip-flops 27%, RAM 18%, clock tree 16% and the ICG consumes 10% of the total power in a typical design. In digital designs, the flip-flops form 20-40% of the digital sub-chips.

A reduction in a number of transistors in a flip-flop will reduce the area and therefore power consumed inside a flip-flop. A reduction in area of flip-flops will directly improve the digital design area and the overall power consumption. A flip-flop consists of a master latch and a slave latch. Both master latch and slave latch requires an even number of inverters. Thus, a minimum of 4 inverters are present in the flip-flop. Thus, a reduction in a number of inverters will directly reduce the area of the flip-flop.

SUMMARY

This Summary is provided to comply with 37 C.F.R. §1.73, requiring a summary of the invention briefly indicating the nature and substance of the invention. It is submitted with the understanding that it will not be used to interpret or limit the scope or meaning of the claims.

An embodiment provides a flip-flop. The flip-flop includes a tri-state inverter that receive a flip-flop input, a clock input and an inverted clock input. A master latch receives an output of the tri-state inverter. The master latch includes a common inverter. A slave latch is coupled to the master latch. The common inverter is shared between the master latch and the slave latch. An output inverter is coupled to the common inverter and generates a flip-flop output.

Other aspects and example embodiments are provided in the Drawings and the Detailed Description that follows.

BRIEF DESCRIPTION OF THE VIEWS OF DRAWINGS

DETAILED DESCRIPTION OF THE EMBODIMENTS

Figure 1:
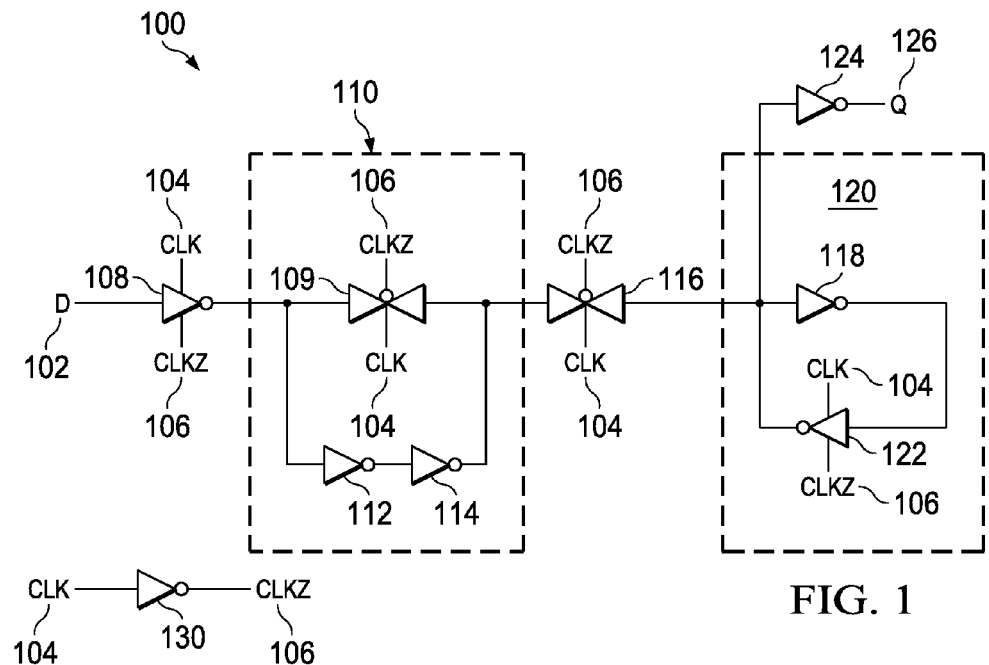
FIG. 1 illustrates a schematic of a flip-flop.

FIG. 1 illustrates a schematic of a flip-flop 100. The flip-flop 100 includes a tri-state inverter 108, a master latch 110, a second transmission gate 116, a slave latch 120, an output inverter 124 and a clock inverter 130. The tri-state inverter 108 receives a flip-flop input D 102, a clock input CLK 104 and an inverted clock input CLKZ 106. The master latch 110 is coupled to the tri-state inverter 108. The master latch 110 includes a first transmission gate 109 that receives an output of the tri-state inverter 108. The first transmission gate 109 also receives the clock input CLK 104 and the inverted clock input CLKZ 106.

The master latch 110 also includes a first inverter 112 and a second inverter 114. The first inverter 112 receives the output of the tri-state inverter 108, and the second inverter 114 receives an output of the first inverter 112. An output of the first transmission gate 109 is equal to an output of the second inverter 114. The output of the first transmission gate 109 is received by the second transmission gate 116. The second transmission gate 116 also receives the clock input CLK 104 and the inverted clock input CLKZ 106.

The slave latch 120 receives an output of the second transmission gate 116. The slave latch 120 includes a third inverter 118 that receives the output of the second transmission gate 116. The slave latch 120 also includes a slave tri-state inverter 122 that receives an output of the third inverter 118. The slave tri-state inverter 122 also receives the clock input CLK 104 and the inverted clock input CLKZ 106. The output inverter 124 receives the output of the second transmission gate 116 and generates the flip-flop output Q 126. The clock inverter 130 receives the clock input CLK 104 and generates the inverted clock input CLKZ 106.

The operation of the flip-flop 100 illustrate in FIG. 1 is explained now. The flip-flop 100 is implemented using PMOS and NMOS transistors. A transistor level implementation of the flip-flop 100 requires 22 transistors. The flip-flop input D 102 is stored using the master latch 110 and the slave latch 120. The output inverter 124 inverts a data received from the slave latch 120 to generate the flip-flop output Q 126.

With the reduction in the number of transistors, a considerable amount of power consumed by the flip-flop 100 can be reduced.

Figure 2:
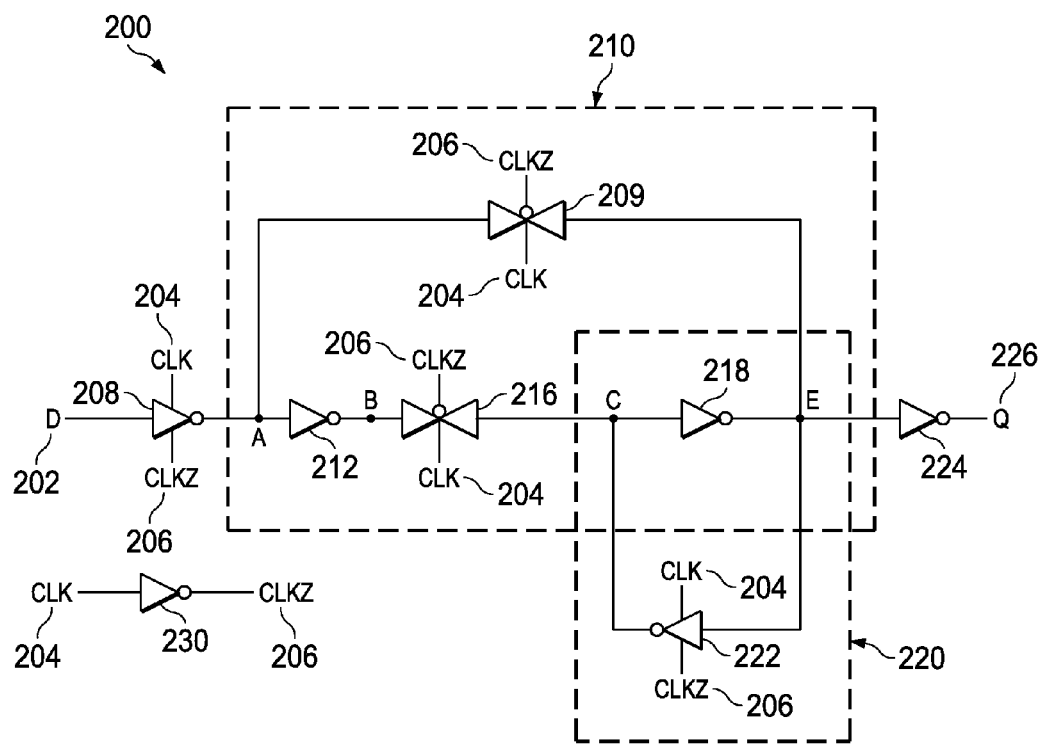
FIG. 2 illustrates a schematic of a flip-flop, according to an embodiment.

FIG. 2 illustrates a schematic of a flip-flop 200, according to an embodiment. The flip-flop 200 includes a tri-state inverter 208, a master latch 210, a slave latch 220, an output inverter 224 and a clock inverter 230. The tri-state inverter 208 receives a flip-flop input D 202, a clock input CLK 204 and an inverted clock input CLKZ 206. The master latch 210 is coupled to the tri-state inverter 208. The master latch 210 includes a first transmission gate 209 that receives an output of the tri-state inverter 208. The first transmission gate 209 also receives the clock input CLK 204 and the inverted clock input CLKZ 206.

The master latch 210 also includes a master inverter 212 that receives the output of the tri-state inverter 208. The second transmission gate 216 is coupled to the master inverter 212. The second transmission gate 216 also receives the clock input CLK 204 and the inverted clock input CLKZ 206. The master latch 210 also includes a common inverter 218.

The common inverter 218 is shared by the master latch 210 and the slave latch 220. The common inverter 218 receives an output of the second transmission gate 216. The slave latch 220 also includes a slave tri-state inverter 222 that receives an output of the first transmission gate 209 and an output of the common inverter 218. The slave tri-state inverter 222 receives the clock input CLK 204 and the inverted clock input CLKZ 206.

The common inverter 218 receives an output of the slave tri-state inverter 222. The output of the first transmission gate 209 is equal to the output of the common inverter 218. Also, the output of the second transmission gate 216 is equal to the output of the slave tri-state inverter 222. The output inverter 224 is coupled to the common inverter 218 and generates flip-flop output Q 226. The clock inverter 230 receives the clock input CLK 204 and generates the inverted clock input CLKZ 206.

In one example, the master latch 210 and the slave latch 220 are configured to receive at least one of a clear signal and a preset signal. The clear signal clear the bit values stored in the master latch 210 and the slave latch 220. The preset signal restores the bit values stored in the master latch 210 and the slave latch 220 to predefined values. The flip-flop 200 may include one or more additional components or inputs known to those skilled in the relevant art and are not discussed here for simplicity of the description.

The operation of the flip-flop 200 illustrated in FIG. 2 is explained now. The flip-flop 200 is one of a positive edge triggered flip-flop and a negative edge triggered flip-flop. The tri-state inverter 208 inverts the flip-flop input D 202 to generate the output of the tri-state inverter 208. A node 'A' receives the output of the tri-state inverter 208. The master inverter 212 inverts the output of the tri-state inverter 208 and a node 'B' receives an output of the master inverter 212.

When clock input CLK 204 is at logic '1', the first transmission gate 209 and the second transmission gate 216 are activated. Hence, a logic at node 'E' is equal to a logic at node 'A' and a logic at node 'C' is equal to a logic at node 'B'. The common inverter 218 inverts the output of the second transmission gate 216 and hence logic at node 'E' is opposite of logic at node 'C'. The slave tri-state inverter 222 receives the logic at node 'E'. The output inverter 224 inverts the logic at node 'E' to generate the flip-flop output Q 226.

The operation of the flip-flop 200 is now explained with the help of logic states. The initial value of the flip-flop output Q 226 is assumed to be logic '1'. In a first state, the clock input CLK 204 is at logic '0' and the flip-flop input D 202 is at logic '0'. The output of the tri-state inverter 208 is at logic 1 i.e. node 'A' is at logic '1'. The output of the master inverter 212 is at logic '0' i.e. node 'B' is at logic '0'. Since, clock input CLK 204 is at logic '0', the first transmission gate 209 and the second transmission gate 216 are inactivated. As the initial value of the flip-flop output Q 226 is logic '1', the node 'E' is at logic '0'. Since node 'E' is at logic '0' and clock input CLK 204 is at logic '0', the output of the slave tri-state inverter 222 is at logic '1' i.e. node 'C' is at logic '1'. The flip-flop output Q 226 remains at logic '1'.

In a second state, the clock input CLK 204 transitions to logic '1' and the flip-flop input D 202 is still at logic '0'. The node 'A' continues to be at logic '1' and node 'B' continues to be at logic '0'. As the clock input CLK 204 is at logic '1', the first transmission gate 209 and the second transmission gate 216 are activated. Thus, node 'C' transitions to logic '0' and node 'E' transitions to logic '1'. Since the first transmission gate 209 is active, node 'A' and node 'E' are maintained at the same state. Thus, the master latch 210 is active and holds a correct value to be provided as the flip-flop output Q 226. The slave tri-state inverter 222 is deactivated because the clock input CLK 204 is at logic '1'. The output inverter 224 inverts the logic at node 'E' and hence the flip-flop output Q 226 is at logic '0'.

In a third state, the clock input CLK 204 transitions to logic '0' and the flip-flop input D 202 transitions from logic '0' to logic '1'. The output of the tri-state inverter 208 i.e. node 'A' transitions to logic '0'. Therefore, the output of the master inverter 212 transitions to logic '1' i.e. node 'B' transitions to logic '1'. The first transmission gate 209 and the second transmission gate 216 are inactivated as the clock input CLK 204 is at logic '0'. Thus, the flip-flop output Q 226 remains at logic '0' as in the second state. Also, node 'E' remains at logic '1' as in the second state. The slave tri-state inverter 222 on receiving logic '1' from node 'E' generates a logic '0'. Thus, node 'C' remains at logic '0'.

In a fourth state, the clock input CLK 204 transitions to logic '1' and the flip-flop input D 202 is still at logic '1'. The node 'A' remains at logic '0' and node 'B' remains at logic '1'. The first transmission gate 209 and the second transmission gate 216 are activated as the clock input CLK 204 is at logic '1'. Thus, the node 'E' transitions to logic '0' and node 'C' transitions to logic '1'. The output inverter 224 inverts the logic at node 'E' and generates the flip-flop output Q 226 which is at logic '1'. The table I summarizes the states of the flip-flop 200,

TABLE 1

|  | Node 'A' | Node 'B' | Node 'C' | Node 'E' | Q |
| --- | --- | --- | --- | --- | --- |
| Clk = 0, D = 0 | 1 | 0 | 1 | 0 | 1 |
| Clk = 1, D = 0 | 1 | 0 | 0 | 1 | 0 |
| Clk = 0, D = 1 | 0 | 1 | 0 | 1 | 0 |
| Clk = 1, D = 1 | 0 | 1 | 1 | 0 | 1 |

Figure 3:
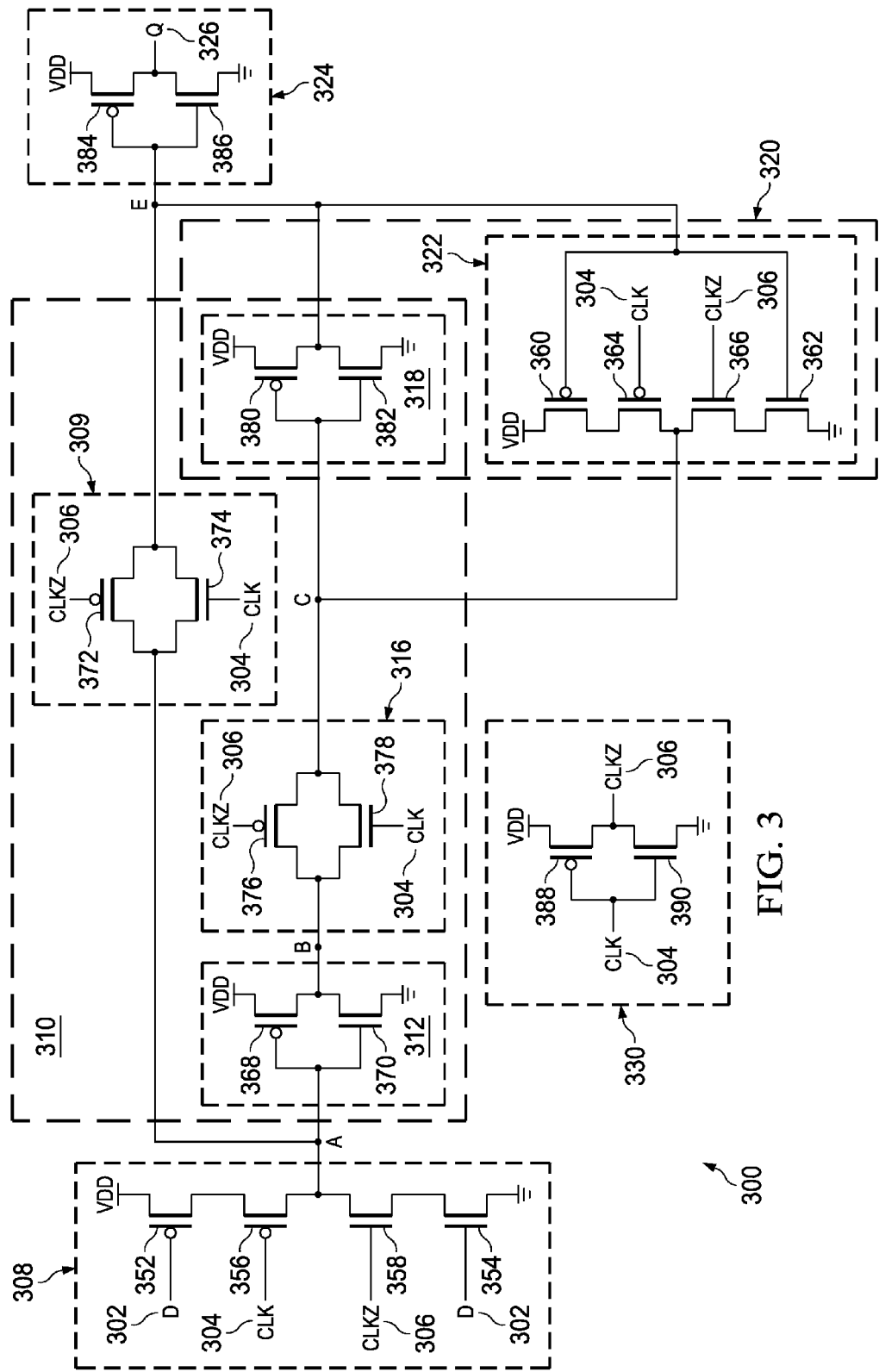
FIG. 3 illustrates a schematic of a transistor level implementation of a flip-flop, according to an embodiment.

FIG. 3 illustrates a schematic of a transistor level implementation of a flip-flop 300, according to another embodiment. The flip-flop 300 is a transistor level implementation of the flip-flop 200. The flip-flop 300 includes a tri-state inverter 308, a master latch 310, a slave latch 320, an output inverter 324 and a clock inverter 330. The tri-state inverter 308 receives a flip-flop input D 302, a clock input CLK 304 and an inverted clock input CLKZ 306. The tri-state inverter 308 includes a first PMOS transistor 352 and a first NMOS transistor 354. A gate terminal of the first PMOS transistor 352 and a gate terminal of the first NMOS transistor 354 receive the flip-flop input D 302.

A source terminal of the first PMOS transistor 352 and a source terminal of the first NMOS transistor 354 are coupled to a power terminal (VDD) and a ground terminal respectively. The tri-state inverter 308 further includes a second PMOS transistor 356 and a second NMOS transistor 358. The second PMOS transistor 356 is coupled to a drain terminal of the first PMOS transistor 352. The second NMOS transistor 358 is coupled to a drain terminal of the first NMOS transistor 354. The second PMOS transistor 356 receives the clock input CLK 304 and the second NMOS transistor 358 receives the inverted clock input CLKZ 306.

A drain terminal of the second PMOS transistor 356 is coupled to a drain terminal of the second NMOS transistor 358 to generate an output of the tri-state inverter 308. In one example, when the flip-flop 300 is a negative edge triggered flip-flop, the second PMOS transistor 356 receives the inverted clock input CLKZ 306 and the second NMOS transistor 358 receives the clock input CLK 304.

The master latch 310 is coupled to the tri-state inverter 308. The master latch 310 includes a first transmission gate 309 that receives an output of the tri-state inverter 308. The first transmission gate 309 also receives the clock input CLK 304 and the inverted clock input CLKZ 306. The first transmission gate 309 includes a PMOS transistor 372 and an NMOS transistor 374. A gate terminal of the PMOS transistor 372 receives the inverted clock input CLKZ 306, and a gate terminal of the NMOS transistor 374 receives the clock input CLK 304. A source terminal of the PMOS transistor 372 and a source terminal of the NMOS transistor 374 are coupled to a node 'A'.

A drain terminal of the PMOS transistor 372 and a drain terminal of the NMOS transistor 374 are coupled to a node 'E'. In one example, when the flip-flop 300 is a negative edge triggered flip-flop, the gate terminal of the PMOS transistor 372 receives the clock input CLK 304, and the gate terminal of the NMOS transistor 374 receives the inverted clock input CLKZ 306.

The master latch 310 also includes a master inverter 312 that receives the output of the tri-state inverter 308. The master inverter 312 includes a PMOS transistor 368 and an NMOS transistor 370. A gate terminal of the PMOS transistor 368 and a gate terminal of the NMOS transistor 370 are coupled to the node 'A'. A source terminal of the PMOS transistor 368 and a source terminal of the NMOS transistor 370 are coupled to the power terminal (VDD) and the ground terminal respectively. A drain terminal of the PMOS transistor 368 and a drain terminal of the NMOS transistor 370 are coupled to generate an output of the master inverter 312. The node 'B' receives the output of the master inverter 312.

The second transmission gate 316 is coupled to the node 'B' and the master inverter 312. The second transmission gate 316 also receives the clock input CLK 304 and the inverted clock input CLKZ 306. The second transmission gate 316 includes a PMOS transistor 376 and an NMOS transistor 378. A gate terminal of the PMOS transistor 376 receives the inverted clock input CLKZ 306, and a gate terminal of the NMOS transistor 378 receives the clock input CLK 304. A source terminal of the PMOS transistor 376 and a source terminal of the NMOS transistor 378 are coupled to the node 'B'. A drain terminal of the PMOS transistor 376 and a drain terminal of the NMOS transistor 378 are coupled to a node 'C'.

In one example, when the flip-flop 300 is a negative edge triggered flip-flop, the gate terminal of the PMOS transistor 376 receives the clock input CLK 304, and the gate terminal of the NMOS transistor 378 receives the inverted clock input CLKZ 306.

The master latch 310 also includes a common inverter 318. The common inverter 318 is shared by the master latch 310 and the slave latch 320. The common inverter 318 receives an output of the second transmission gate 316. The common inverter 318 includes a fifth PMOS transistor 380 and a fifth NMOS transistor 382. A gate terminal of the fifth PMOS transistor 380 and a gate terminal of the fifth NMOS transistor 382 are coupled to each other and receive the output of the second transmission gate 316. A source terminal of the fifth PMOS transistor 380 and a source terminal of the fifth NMOS transistor 382 are coupled to a power terminal (VDD) and a ground terminal respectively. A drain terminal of the fifth PMOS transistor 380 is coupled to a drain terminal of the fifth NMOS transistor 382 to generate an output of the common inverter 318 at the node 'E'.

The slave latch 320 also includes a slave tri-state inverter 322 that receives an output of the first transmission gate 309 and an output of the common inverter 318. The output of the first transmission gate 309 is equal to the output of the common inverter 318. Also, the output of the second transmission gate 316 is equal to the output of the slave tri-state inverter 322. The slave tri-state inverter 322 receives the clock input CLK 304 and the inverted clock input CLKZ 306. The slave tri-state inverter 322 includes a third PMOS transistor 360 and a third NMOS transistor 362. A gate terminal of the third PMOS transistor 360 and a gate terminal of the third NMOS transistor 362 receive the output of the common inverter 318. A source terminal of the third PMOS transistor 360 and a source terminal of the third NMOS transistor 362 are coupled to the power terminal (VDD) and the ground terminal respectively.

The slave tri-state inverter 322 also includes a fourth PMOS transistor 364 and a fourth NMOS transistor 366. The fourth PMOS transistor 364 is coupled to a drain terminal of the third PMOS transistor 360 and the fourth NMOS transistor 366 is coupled to a drain terminal of the third NMOS transistor 362. A gate terminal of the fourth PMOS transistor 364 receives a clock input CLK 304 and a gate terminal of the fourth NMOS transistor 366 receives the inverted clock input CLKZ 306. A drain terminal of the fourth PMOS transistor 364 is coupled to a drain terminal of the fourth NMOS transistor 366 to generate an output of the slave tri-state inverter 322.

The common inverter 318 receives an output of the slave tri-state inverter 322. The output inverter 324 is coupled to the common inverter 318 and generates flip-flop output Q 326. The output inverter 324 includes a sixth PMOS transistor 384 and a sixth NMOS transistor 386. A gate terminal of the sixth PMOS transistor 384 and a gate terminal of the sixth NMOS transistor 386 receive the output of the common inverter 318. A source terminal of the sixth PMOS transistor 384 and a source terminal of the sixth NMOS transistor 386 are coupled to the power terminal (VDD) and the ground terminal respectively. A drain terminal of the sixth PMOS transistor 384 is coupled to a drain terminal of the sixth NMOS transistor 386 to generate the flip-flop output Q 326.

The clock inverter 330 receives the clock input CLK 304 and generates the inverted clock input CLKZ 306. The clock inverter 330 includes a PMOS transistor 388 and an NMOS transistor 390. A gate terminal of the PMOS transistor 388 and a gate terminal of the NMOS transistor 390 receive the clock input CLK 304. A source terminal of the PMOS transistor 388 and a source terminal of the NMOS transistor 390 are coupled to the power terminal (VDD) and the ground terminal respectively. A drain terminal of the PMOS transistor 388 is coupled to a drain terminal of the NMOS transistor 390 to generate the inverted clock input CLKZ 306.

In one example, the master latch 310 and the slave latch 320 are configured to receive at least one of a clear signal and a preset signal. The clear signal clear the bit values stored in the master latch 310 and the slave latch 320. The preset signal restores the bit values stored in the master latch 310 and the slave latch 320 to predefined values. The operation of the flip-flop 300 is similar to the operation of the flip-flop 200 and is thus not explained here for brevity of the description.

Figure 4:
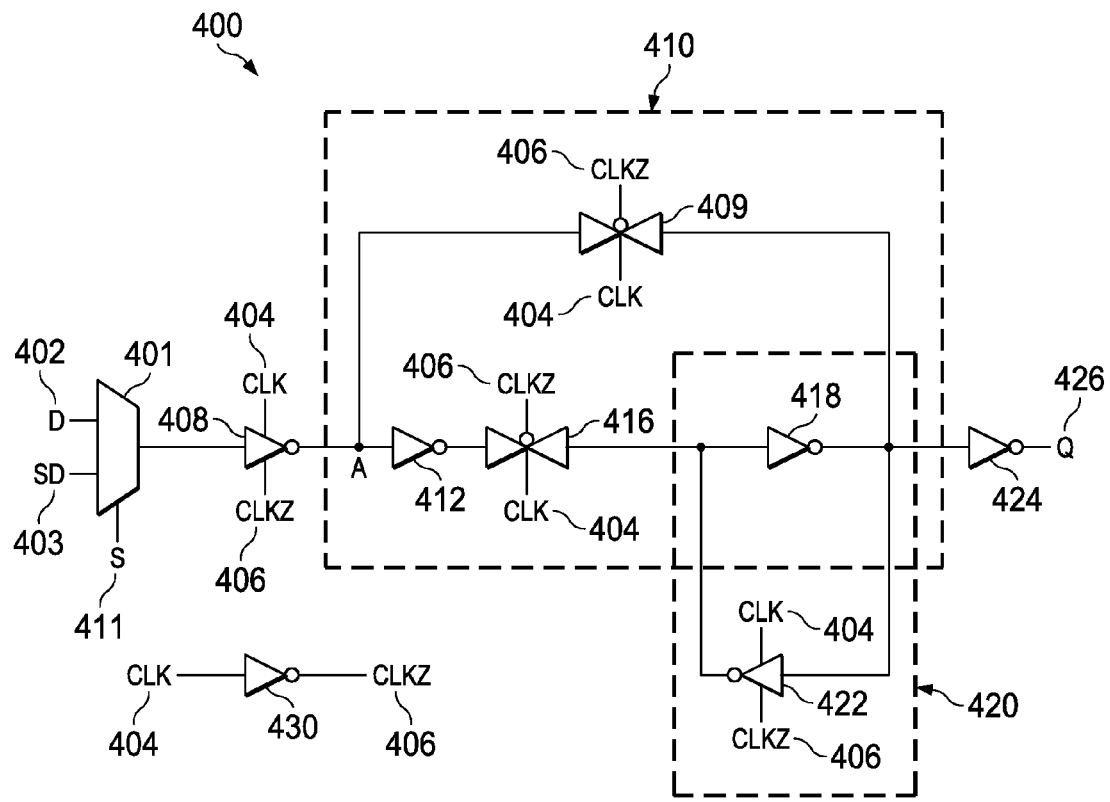
FIG. 4 illustrates a schematic of a scan flip-flop, according to an embodiment.

FIG. 4 illustrates a schematic of a scan flip-flop 400, according to yet another embodiment. The scan flip-flop 400 includes a multiplexer 401, a tri-state inverter 408, a master latch 410, a slave latch 420, an output inverter 424 and a clock inverter 430. The multiplexer 401 receives a flip-flop input D 402, a scan data input (SD) 403 and a scan enable signal (S) 411. The multiplexer 401 is coupled to the tri-state inverter 408. The tri-state inverter 408 receives an output of the multiplexer 401, a clock input CLK 404 and an inverted clock input CLKZ 406. The master latch 410 is coupled to the tri-state inverter 408. The master latch 410 includes a first transmission gate 409 that receives an output of the tri-state inverter 408. The first transmission gate 409 also receives the clock input CLK 404 and the inverted clock input CLKZ 406.

The master latch 410 also includes a master inverter 412 that receives the output of the tri-state inverter 408. The second transmission gate 416 is coupled to the master inverter 412. The second transmission gate 416 also receives the clock input CLK 404 and the inverted clock input CLKZ 406. The master latch 410 also includes a common inverter 418.

The common inverter 418 is shared by the master latch 410 and the slave latch 420. The common inverter 418 receives an output of the second transmission gate 416. The slave latch 420 also includes a slave tri-state inverter 422 that receives an output of the first transmission gate 409 and an output of the common inverter 418. The slave tri-state inverter 422 receives the clock input CLK 404 and the inverted clock input CLKZ 406.

The common inverter 418 receives an output of the slave tri-state inverter 422. The output of the first transmission gate 409 is equal to the output of the common inverter 418. Also, the output of the second transmission gate 416 is equal to the output of the slave tri-state inverter 422. The output inverter 424 is coupled to the common inverter 418 and generates flip-flop output Q 426. The clock inverter 430 receives the clock input CLK 404 and generates the inverted clock input CLKZ 406.

In one example, the master latch 410 and the slave latch 420 are configured to receive at least one of a clear signal and a preset signal. The clear signal clear the bit values stored in the master latch 410 and the slave latch 420. The preset signal restores the bit values stored in the master latch 410 and the slave latch 420 to predefined values. The scan flip-flop 400 may include one or more additional components or inputs known to those skilled in the relevant art and are not discussed here for simplicity of the description.

The operation of the scan flip-flop 400 illustrated in FIG. 4 is explained now. The multiplexer 401 selects one of the flip-flop input D 402 and the scan data input (SD) 403 based on the scan enable signal (S) 411. The multiplexer 401 provides one of the flip-flop input D 402 and the scan data input (SD) 403 to the tri-state inverter 408. The processing of one of the flip-flop input D 402 and the scan data input (SD) 403 in the tri-state inverter 408, the master latch 410, the slave latch 420 and the output inverter 424 is similar to the processing of the flip-flop input (D) 202 in the flip-flop 200 as explained in connection with FIG. 2. Therefore, the complete operation of the scan flip-flop 400 is not discussed here for simplicity of the description. It is noted that the scan flip-flop 400 can be a positive edge triggered flip-flop or a negative edge triggered flip-flop. The embodiments discussed in connection with FIG. 2 and FIG. 3 are applicable to the scan flip-flop 400 and variations, and alternative constructions are apparent and well within the spirit and scope of the disclosure.

Figure 5:
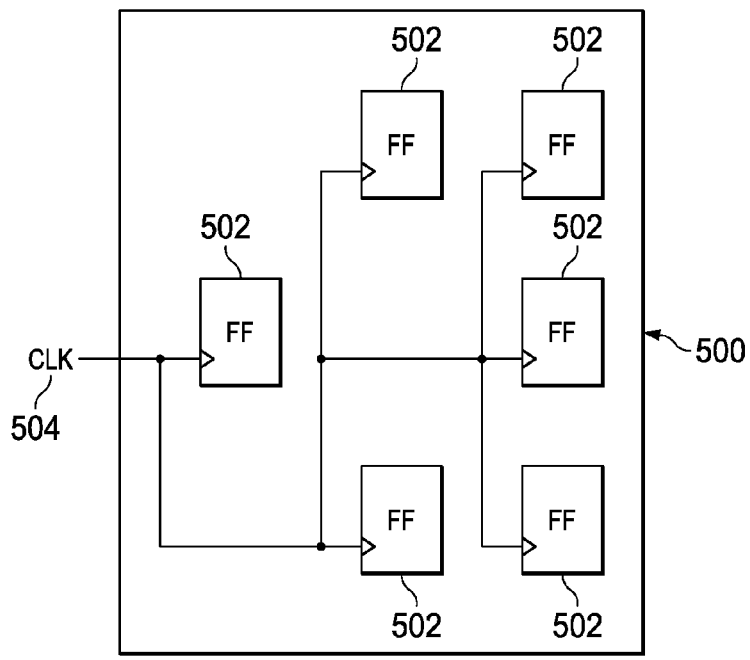
FIG. 5 illustrates schematic of an apparatus, according to the embodiment.

FIG. 5 illustrates schematic of an apparatus 500, according to still another embodiment. The apparatus 500 includes a clock input 504 and a plurality of flip-flops. Each flip-flop 502 of the plurality of flip-flops is configured to receive the clock input 504. Each flip-flop 502 of the plurality of flip-flops is analogous to at least one of the flip-flop 200, flip-flop 300 and scan flip-flop 400, in both connections and operations and thereby not repeated for the sake of simplicity.

The apparatus 500 includes the large numbers of flip-flops 502, hence with reduced transistor count, the power consumed by the apparatus 500 can be reduced. In the flip-flop 502 the transistor count is being reduced which results in reduced power consumption as compared to flip-flop 100. This reduces power consumption in the apparatus 500. Also, the flip-flops 502 require less area as compared to flip-flop 100 thereby reducing the area required by the apparatus 500 considerably.

In the foregoing discussion, the terms "connected" means at least either a direct electrical connection between the devices connected or an indirect connection through one or more passive intermediary devices. The term "circuit" means at least either a single component or a multiplicity of passive components, that are connected together to provide a desired function. The term "signal" means at least one current, voltage, charge, data, or other signal. Also, the terms "coupled to" or "couples with" (and the like) are intended to describe either an indirect or direct electrical connection. Thus, if a first device is coupled to a second device, that connection can be through a direct electrical connection, or through an indirect electrical connection via other devices and connections. Further, the term "high" is generally intended to describe a signal that is at logic "1," and the term "low" is generally intended to describe a signal that is at logic "0." The term "on" applied to a transistor or group of transistors is generally intended to describe gate biasing to enable current flow through the transistor or transistors.

The foregoing description sets forth numerous specific details to convey a thorough understanding of the invention. However, it will be apparent to one skilled in the art that the invention may be practiced without these specific details. Well-known features are sometimes not described in detail in order to avoid obscuring the invention. Other variations and embodiments are possible in light of above teachings, and it is thus intended that the scope of invention not be limited by this Detailed Description, but only by the following Claims.

What is claimed is:

1. A flip-flop comprising:
   a tri-state inverter configured to receive a flip-flop input, a clock input and an inverted clock input;
   a master latch configured to receive an output of the tri-state inverter, the master latch comprising a common inverter;
   an output inverter coupled to the common inverter and configured to generate a flip-flop output; and
   a slave latch coupled to the master latch, the slave latch comprising a slave tri-state inverter, the slave tri-state inverter configured to receive an output of the common inverter, wherein the common inverter is shared between the master latch and the slave latch, and the common inverter is configured to receive an output of the slave tri-state inverter.

2. The flip-flop of claim 1 further comprising a clock inverter configured to generate the inverted clock input in response to the clock input.

3. The flip-flop of claim 1 is at least one of a positive edge triggered flip-flop and a negative edge triggered flip-flop.

4. The flip-flop of claim 1, wherein the master latch comprises:
   a first transmission gate configured to receive the output of the tri-state inverter, the clock input and the inverted clock input;
   a master inverter configured to receive the output of the tri-state inverter; and
   a second transmission gate coupled to the master inverter and configured to receive the clock input and the inverted clock input, wherein the common inverter is configured to receive an output of the second transmission gate.

5. The flip-flop of claim 4, wherein the slave tri-state inverter is configured to receive an output of the first transmission gate.

6. The flip-flop of claim 5, wherein the slave tri-state inverter is configured to receive the clock input and the inverted clock input.

7. The flip-flop of claim 4, wherein the output of the first transmission gate is equal to the output of the common inverter and the output of the second transmission gate is equal to the output of the slave tri-state inverter.

8. The flip-flop of claim 1, wherein the output inverter is configured to generate the flip-flop output in response to the output of the common inverter.

9. The flip-flop of claim 1, wherein the tri-state inverter comprises:

a first PMOS transistor and a first NMOS transistor, a gate terminal of the first PMOS transistor and a gate terminal of the first NMOS transistor configured to receive the flip-flop input;

a second PMOS transistor coupled to a drain terminal of the first PMOS transistor and configured to receive the clock input; and a second NMOS transistor coupled to a drain terminal of the first NMOS transistor and configured to receive the inverted clock input, wherein a drain terminal of the second PMOS transistor is coupled to a drain terminal of the second NMOS transistor to generate the output of the tri-state inverter.

10. The flip-flop of claim 4, wherein the each of the first transmission gate and the second transmission gate comprises:

a PMOS transistor, a gate terminal of the PMOS transistor configured to receive the inverted clock input; and an NMOS transistor, a gate terminal of the NMOS transistor configured to receive the clock input.

11. The flip-flop of claim 1, wherein the slave tri-state inverter comprises:

a third PMOS transistor and a third NMOS transistor, a gate terminal of the third PMOS transistor and a gate terminal of the third NMOS transistor configured to receive the output of the common inverter;

a fourth PMOS transistor coupled to a drain terminal of the third PMOS transistor and configured to receive the clock input; and a fourth NMOS transistor coupled to a drain terminal of the third NMOS transistor and configured to receive the inverted clock input, wherein a drain terminal of the fourth PMOS transistor is coupled to a drain terminal of the fourth NMOS transistor to generate the output of the slave tri-state inverter.

12. The flip-flop of claim 4, wherein the common inverter comprises a fifth PMOS transistor and a fifth NMOS transistor, a gate terminal of each of the fifth PMOS transistor and the fifth NMOS transistor configured to receive the output of the second transmission gate, and a drain terminal of the fifth PMOS transistor is coupled to a drain terminal of the fifth NMOS transistor to generate the output of the common inverter.

13. The flip-flop of claim 1, wherein the output inverter comprises a sixth PMOS transistor and a sixth NMOS transistor, a gate terminal of each of the sixth PMOS transistor and the sixth NMOS transistor configured to receive the output of the common inverter, and a drain terminal of the sixth PMOS transistor is coupled to a drain terminal of the sixth NMOS transistor to generate the flip-flop output.

14. The flip-flop of claim 1, wherein a source terminal of each of the first PMOS transistor, the third PMOS transistor, the fifth PMOS transistor and the sixth PMOS transistor are coupled to a power terminal.

15. The flip-flop of claim 1, wherein a source terminal of each of the first NMOS transistor, the third NMOS transistor, the fifth NMOS transistor and the sixth NMOS transistor are coupled to a ground terminal.

16. The flip-flop of claim 1, wherein the master latch and the slave latch are configured to receive at least one of a clear signal and a preset signal.

17. The flip-flop of claim 1 further comprising a multiplexer coupled to the tri-state inverter, the multiplexer configured to receive the flip-flop input and a scan data input.

18. The flip-flop of claim 17, wherein the multiplexer is configured to receive a scan enable to select one of the flip-flop input and the scan data input, and the multiplexer is configured to provide one of the flip-flop input and the scan data input to the tri-state inverter.

19. An apparatus comprising:

a clock input;

a plurality of flip-flops configured to receive the clock input, wherein each of the flip-flop comprises:

a tri-state inverter configured to receive a flip-flop input, the clock input and an inverted clock input;

a master latch configured to receive an output of the tri-state inverter, the master latch comprising a common inverter;

an output inverter coupled to the common inverter and configured to generate a flip-flop output; and a slave latch coupled to the master latch, the slave latch comprising a slave tri-state inverter, the slave tri-state inverter configured to receive an output of the common inverter, wherein the common inverter is shared between the master latch and the slave latch, and the common inverter is configured to receive an output of the slave tri-state inverter.

20. A method comprising:

providing a tri-state inverter configured to receive a flip-flop input, a clock input and an inverted clock input;

providing a master latch configured to receive an output of the tri-state inverter, the master latch comprising a common inverter;

providing an output inverter coupled to the common inverter and configured to generate a flip-flop output; and providing a slave latch coupled to the master latch, the slave latch comprising a slave tri-state inverter, the slave tri-state inverter configured to receive an output of the common inverter, wherein the common inverter is shared between the master latch and the slave latch, and the common inverter is configured to receive an output of the slave tri-state inverter.

* * * * *